United States Patent
Boesch et al.

[11] Patent Number: 6,157,821
[45] Date of Patent: Dec. 5, 2000

[54] VOLTAGE STEP UP FOR A LOW VOLTAGE FREQUENCY SYNTHESIZER ARCHITECTURE

[75] Inventors: Ronald D. Boesch, Morrisville; Christopher Koszarsky, Holly Springs, both of N.C.

[73] Assignee: Ericsson Inc., Research Triangle Park, N.C.

[21] Appl. No.: 08/956,947

[22] Filed: Oct. 23, 1997

[51] Int. Cl.[7] ................................. H04B 1/60; H03L 7/06
[52] U.S. Cl. ................ 455/260; 455/264; 327/157; 331/17
[58] Field of Search ................ 331/17, 4, 14, 331/34; 455/343, 76, 260, 261, 262, 263, 264, 265, 255, 257, 259; 327/157, 156

[56] References Cited

U.S. PATENT DOCUMENTS

| | | | |
|---|---|---|---|
| 4,281,259 | 7/1981 | Ozawa | 327/5 |
| 4,736,167 | 4/1988 | Kojima et al. | 331/17 |
| 4,755,774 | 7/1988 | Heck | 332/123 |
| 4,803,612 | 2/1989 | Skovmand | 323/284 |
| 4,893,094 | 1/1990 | Herold et al. | 331/1 A |
| 5,157,354 | 10/1992 | Saiki et al. | 331/1 A |
| 5,315,623 | 5/1994 | Kuo | 375/376 |
| 5,339,050 | 8/1994 | Llewellyn | 331/16 |
| 5,359,300 | 10/1994 | Minami | 331/17 |
| 5,581,214 | 12/1996 | Iga | 331/16 |
| 5,623,523 | 4/1997 | Gehrke | 375/376 |
| 5,635,776 | 6/1997 | Imi | 307/110 |
| 5,692,023 | 11/1997 | Clark | 375/376 |
| 5,757,240 | 5/1998 | Boerstler et al. | 331/34 |
| 5,774,023 | 6/1998 | Irwin | 331/17 |
| 5,815,042 | 9/1998 | Chow et al. | 331/57 |
| 5,818,303 | 10/1998 | Oishi et al. | 331/1 A |
| 5,831,483 | 11/1998 | Fukuda | 331/17 |
| 5,838,180 | 11/1998 | Partyka | 327/157 |

FOREIGN PATENT DOCUMENTS

| | | |
|---|---|---|
| 0 829 968 | 3/1998 | European Pat. Off. . |
| 8-162951 | 6/1996 | Japan . |

OTHER PUBLICATIONS

Motorola HT 1000, MT 2000, MTS 2000 and MTX Series Handie–Talkie Portable Radios Theory/Troubleshooting Manual (1993), Motorola, Inc., pp. 12–13.

NUD7070A VHF Transciever Board Component Location Diagrams and Schematic Diagram.

*Primary Examiner*—Reinhard J. Eisenzopf
*Assistant Examiner*—Charles N. Appiah
*Attorney, Agent, or Firm*—Burns, Doane, Swecker & Mathis, L.L.P.

[57] ABSTRACT

When attempting to reduce the number of battery cells in cellular telephones, a frequency synthesizer or phase locked loop located within the cellular telephone will output an increasing amount of noise. In order to reduce the amount of noise output when reducing the number of battery cells in such systems, the present invention employs a voltage step up device which effectively increases the voltage range of a voltage controlled oscillator within the frequency synthesizer. To further reduce the noise, the voltage step-up unit is employed with passive elements thus reducing the noise further and optimizing the output of the phase locked loop. Several different designs are discussed to further reduce space requirements and increase programmability of the system.

13 Claims, 8 Drawing Sheets

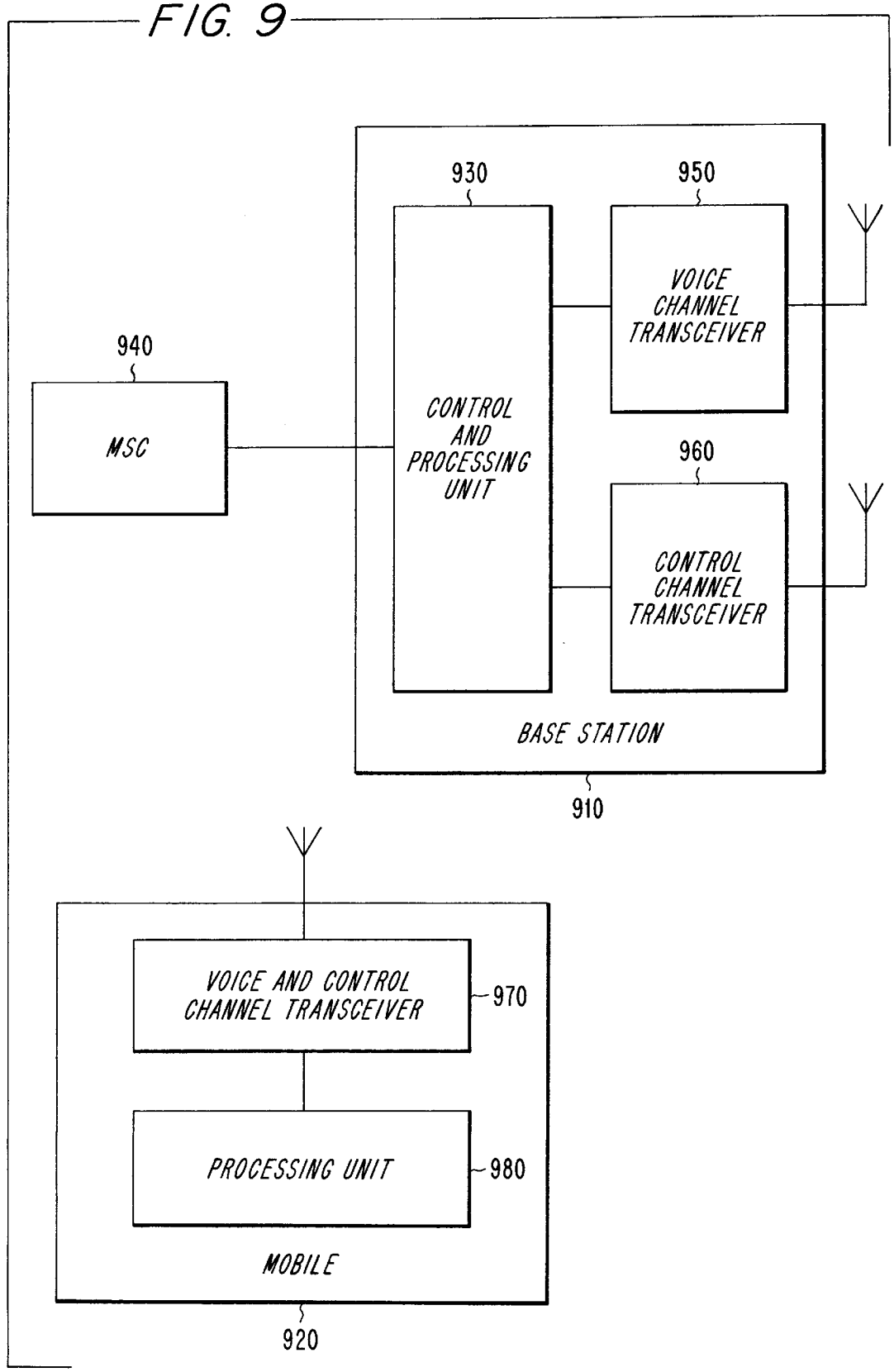

VOLTAGE STEP UP FOR A LOW VOLTAGE FREQUENCY SYNTHESIZER ARCHITECTURE

BACKGROUND

The present invention generally relates to radiocommunication systems and, more specifically to an apparatus and associated method for efficiently reducing the number of battery cells within mobile units (e.g. dual band phones) without increasing noise or spurs.

Voltage controlled oscillators (VCOs) are widely used in communication devices such as cellular telephones to generate oscillatory signals. In particular, a voltage controlled oscillator is one of the components of a phase-locked loop or PLL, which is an electronic circuit used to generate a stable oscillatory signal having a desired frequency of oscillation. Such circuits are commonly referred to as frequency synthesizers. The signal output by a PLL frequency synthesizer may be used, for example, as a carrier signal in a transmitter or as a local oscillator signal in a receiver.

In order to tune a transmitter or receiver to a particular frequency, it is necessary to alter the frequency of oscillation of the carrier or local oscillator signal in a controlled manner. This can be achieved by synthesizing the carrier and local oscillator signals using a programmable frequency synthesizer including a VCO. A VCO is tuned by varying an input DC control voltage level.

Most portable electronic devices use a five-cell or four-cell battery to generate DC power. Devices having five-cell and four-cell batteries can generate a regulated DC power supply voltage level of about 4.8 volts and 3.8 volts, respectively. In the case of a five-cell battery, the DC voltage control signal, $V_C$, used as a control input to the VCO has a range of between about 0.7 and 4.3 volts, or approximately 3.6 volts. In the case of a four-cell battery, $V_C$ has a range of between about 0.6 and 3.0 volts, or 2.4 volts. The measure of the frequency responsiveness of a VCO with respect to input control voltage $V_C$ is known as the gain of the VCO, and is measured in megahertz per volt (MHz/V). Thus, if the input control voltage has a lower range, the VCO should have a greater gain in order to be tunable over the same frequency range.

To be useful in an RF communication device such as a dual band cellular telephone, a voltage controlled oscillator should be tunable over a range of approximately 90 MHz for some applications. Thus, a VCO for use in a device having a five-cell supply has a gain of about 26 MHz/Volt. A VCO for use in a device having a four-cell supply has a gain of about 40 MHz/Volt.

One drawback to a VCO is the fact that it produces a certain amount of phase noise, which can degrade the performance of a communications system. A VCO must be designed such that phase noise is kept within certain predetermined limits. In a voltage controlled oscillator, phase noise follows two rules. The first is that phase noise is directly proportional to the gain of the oscillator. The second is that the phase noise is inversely proportional to the magnitude of the control voltage, which is applied across the varactor. Both rules are based upon the fact that the varactor diode in a VCO exhibits an internal resistance that is greater when a low control voltage range is applied across its terminals. This greater internal resistance decreases the quality factor of the oscillator's resonant circuit leading to increased phase noise. The former rule simply implies that the greater the gain of the oscillator, the greater the varactor diode's contribution to the quality factor of the resonant circuit. Thus a high gain VCO with a low control voltage range would exhibit the poorest phase noise characteristics.

There is currently a trend in the communication industry to design and produce electronic devices capable of operating with a three-cell battery. A three-cell battery provides a control voltage range of from about 0.5 to 2.2 volts, or 1.7 volts. A conventional VCO having a gain corresponding to such a control voltage range would exhibit unacceptable phase noise characteristics. A VCO used in each band of a dual band phone system would solve the voltage requirement problem, however, two VCOs require too much space and are expensive. Also, a switch VCO tank circuit could also be used to remedy the reduction in batteries. However, the use of the switch increases standby time in any band which draws current. Thus, there is a need for a voltage controlled oscillator and related control circuitry which exhibits acceptable phase noise performance in a device having a low supply voltage level.

SUMMARY

It is therefore an object of the present invention to provide a voltage controlled oscillator having improved phase noise performance when operated using a low supply voltage.

It is a further object of the invention to provide a circuit for controlling the VCO according to the present invention. It is still a further object of the invention to provide a phase locked loop incorporating a VCO according to the present invention.

The present invention addresses the problems associated with reducing the number of battery cells in, for example, a cellular phone while continuing to meet the VCO's gain requirements. An exemplary embodiment of the invention also addresses the problem of how to reduce the number of spurs and the amount of noise in the VCO which might otherwise occur through implementation of a voltage multiplier outputting an increased voltage to the charge pumps located in the synthesizer.

Another object of the present invention is to eliminate the side effects which result from the use of a voltage step-up device. Specifically, exemplary embodiments allow for a reduced number of parts needed for filtering the stepped-up voltage and a reduction in the sources of RF interference.

Exemplary embodiments of the invention employ a voltage multiplier in combination with a charge pump. The voltage multiplier employs four switches, a bucket capacitor and a reservoir capacitor. Pairs of switches are closed and opened in a predetermined sequence to amplify the output voltage. The amplified voltage is then input to the charge pump. By using a reference frequency drawn from an existing clock source as an input, the voltage step-up unit is not required to have its own oscillator. As a result, space is saved and expensive hardware is not required to be used.

An exemplary embodiment provides a reference frequency signal to the voltage step-up unit from the input to the phase detector of the frequency synthesizer. Another exemplary embodiment provides the reference frequency signal to the voltage multiplier from the input to a divider upstream of the phase detector. This allows for a programmable divider to be employed to increase the programmability and controllability of the voltage step-up device.

BRIEF DESCRIPTION OF THE DRAWINGS

These and other features, objects and advantages associated with the present invention will be more readily understood upon reading the following detailed description when read in conjunction with the drawings in which like reference numerals refer to like elements and where:

FIG. 9 is a block diagram of a cellular mobile radio telephone system in accordance with an exemplary embodiment of the present invention.

DETAILED DESCRIPTION

The present invention will now be described with reference to the accompanying drawings, in which various exemplary embodiments of the invention are shown. However, this invention may be embodied in many different forms and should not be construed as limited to the specific embodiments shown.

Figure 1:
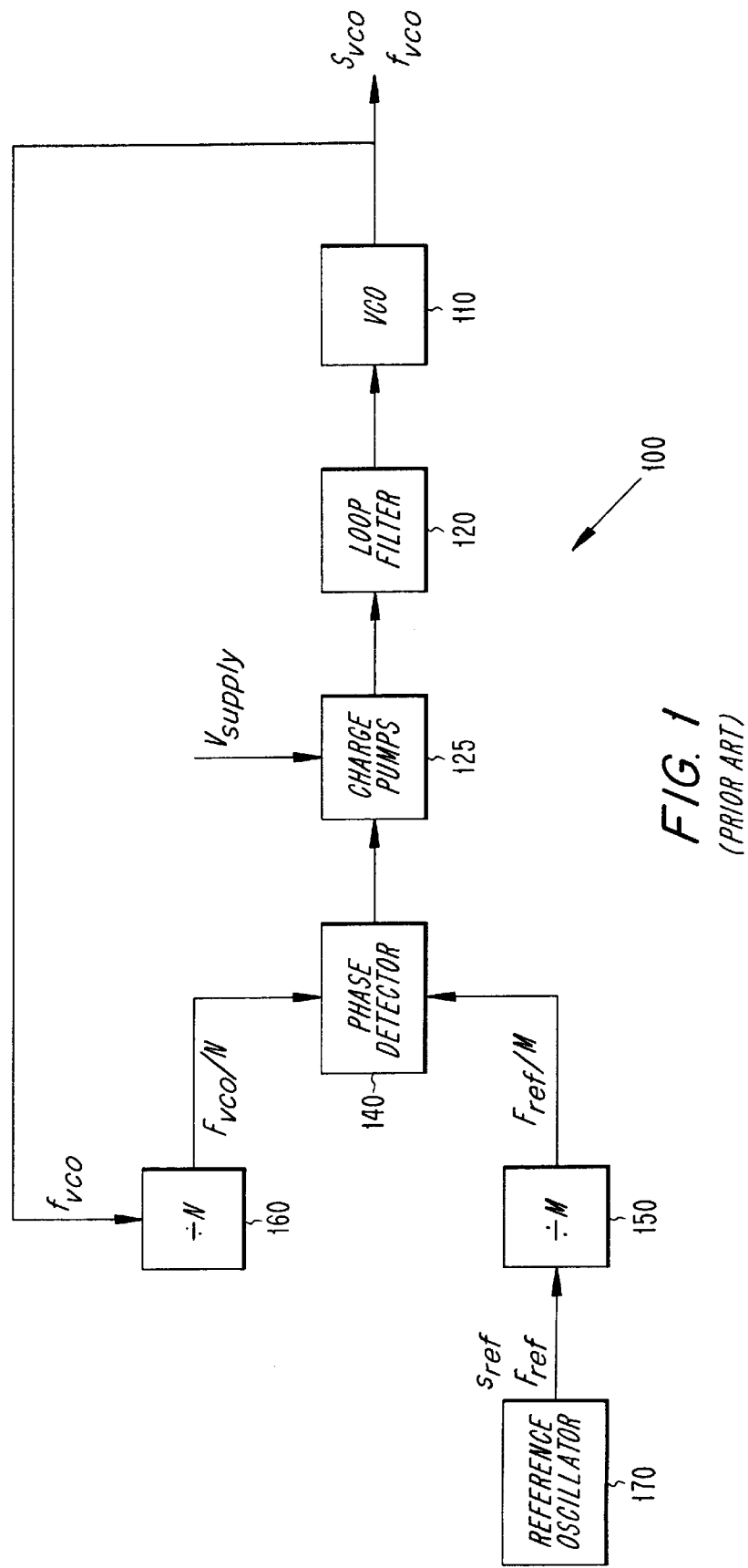
FIG. 1 is a block diagram of a conventional phase locked loop circuit.

A block diagram of a typical phase locked loop incorporating a voltage controlled oscillator is shown in FIG. 1. A reference oscillator 170 generates a reference signal $S_{ref}$ at a predetermined frequency of oscillation. The frequency of the reference signal $S_{ref}$ is fixed at $F_{ref}$, and is dependent on the construction of the reference oscillator 170.

In a typical communications application, reference oscillator 170 is a temperature compensated crystal oscillator (TCXO) or oven-controlled crystal oscillator (OCXO) having a stable frequency of oscillation of 19.44 MHz. Such oscillators are highly stable, capable of maintaining a frequency of oscillation within approximately 3–5 parts per million.

The reference signal $S_{ref}$ is passed through a divide-by-M circuit 150 which divides the frequency of oscillation of $S_{ref}$ by a selected integer value (M). The divided signal is then provided to an input of a phase detector 140. Phase detector 140 generates a DC voltage signal that is proportional to the phase difference between two input oscillatory signals, one of which is the reference signal having a frequency of $F_{ref}/M$.

The output signal of phase detector 140, is passed to charge pumps 125. The function of the charge pumps 125 is to, utilizing a supply voltage $V_{supply}$, control the voltage controlled oscillator (VCO) 110 based upon the received DC voltage signal from the phase detector 140. The charge pumps 125 adjust the voltage that is applied to the VCO. Depending upon the signal from the phase detector 140, the charge pumps 125 will increase or decrease current thus controlling voltage applied to the VCO 110.

The output of the charge pumps 125, is first passed through loop filter 120 to remove residual AC elements, before being used to control the frequency of the VCO 110. The output signal of VCO 110 (which is also the output signal of PLL 100) is passed through a divide-by-N circuit 160 and fed into a second input port of phase detector 140. Thus, phase detector 140 compares the phase of a signal of frequency $F_{ref}/M$ with the phase of a signal of frequency $F_{VCO}/N$. Depending on the values of the circuit elements included in the VCO 110, the PLL 100 output signal $S_{VCO}$ will eventually settle on a stable frequency of oscillation that is equal to $F_{ref}N/M$). A microprocessor may be used to change the values of M and N. In this manner, the frequency of oscillation of the output signal $F_{VCO}$ may be digitally controlled.

Thus, it is apparent that a voltage controlled oscillator is a key element of a frequency synthesizer, since it permits a frequency of oscillation to be selected based on an applied input voltage.

Figure 2:
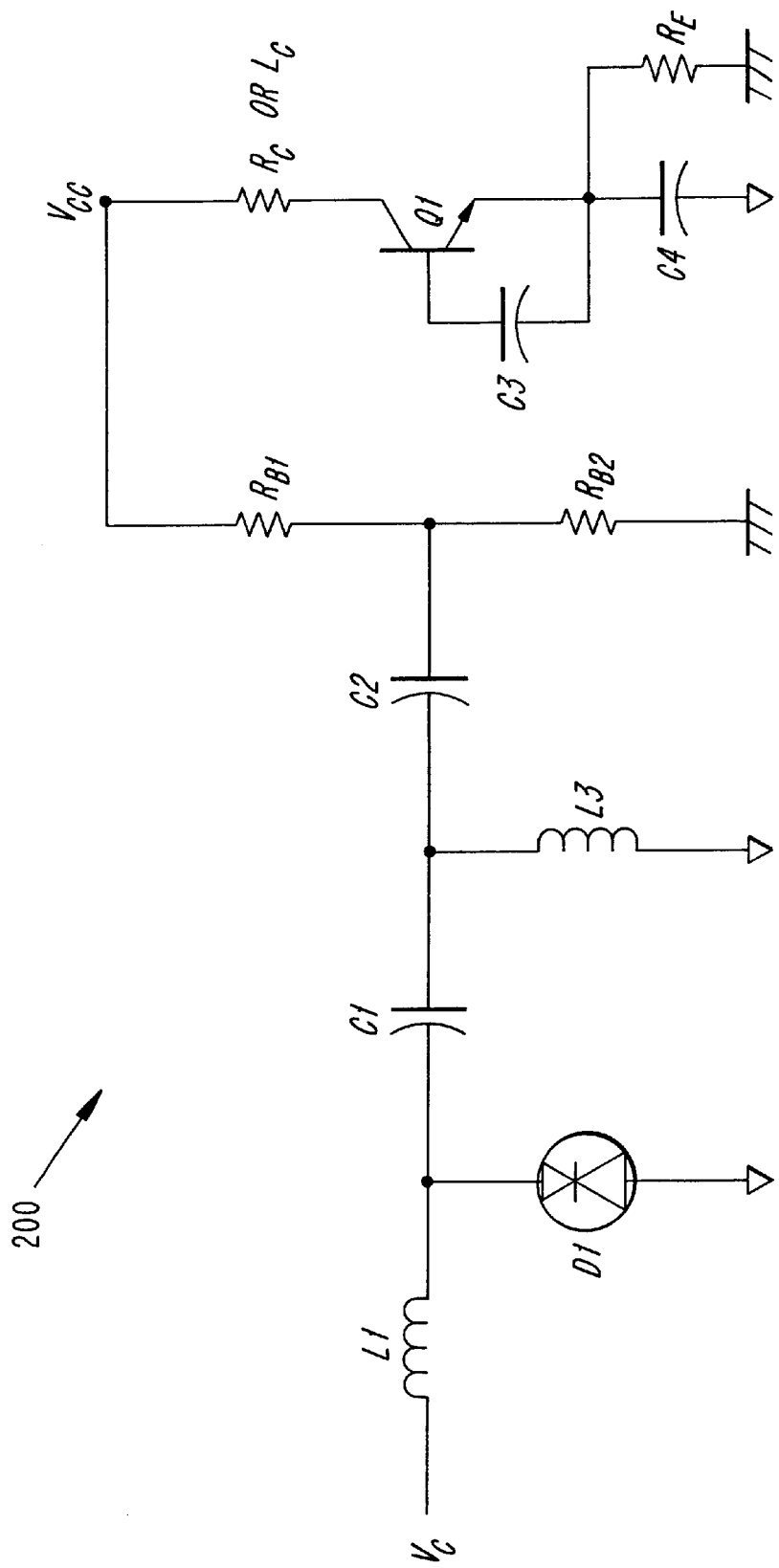
FIG. 2 is a schematic diagram of a conventional voltage controlled oscillator.

FIG. 2 illustrates a schematic diagram of a well known voltage controlled oscillator (VCO) circuit 200. VCO 200 includes a control voltage input $V_c$ applied to an inductor L1, which functions as an RF choke. Inductor L1 is operatively coupled to an LC network comprising varactor diode D1, inductor L3, and capacitors C1 and C2. C2 is also coupled to the base of transistor Q1. A capacitor C3 is coupled between the base and emitter of transistor Q1, and a capacitor C4 is coupled between the emitter of transistor Q1 and ground. Varactor diode D1, capacitor C1 and inductor L3 form a resonant circuit which determines the frequency of operation of VCO 200. The capacitance of varactor diode D1 is determined by the DC voltage applied across its terminals by $V_C$. Thus, the frequency of oscillation of VCO 200 is determined by the input DC voltage level $V_C$.

Figure 3:
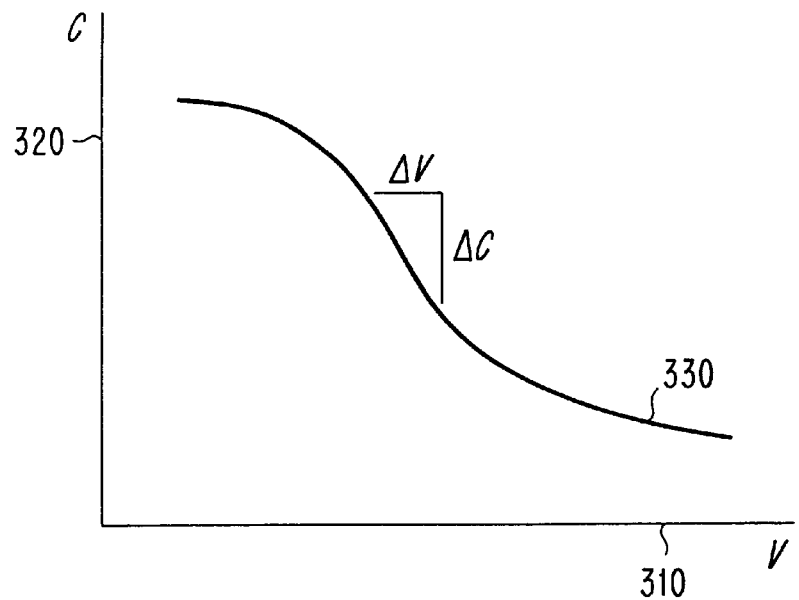
FIG. 3 is a graph showing a representative C-V characteristic of a varactor diode.

As illustrated in FIG. 3, the capacitance of varactor diode D1 is a function of the DC voltage applied across its terminals. As the voltage across diode D1 increases, its capacitance decreases. Since varactor diode D1 is an element of the resonant circuit which determines the frequency of oscillation of VCO 200, a change in the capacitance of varactor diode D1 (due to change in the level of control voltage $V_C$) will result in a change in the frequency of oscillation of the VCO 200.

Figure 4:
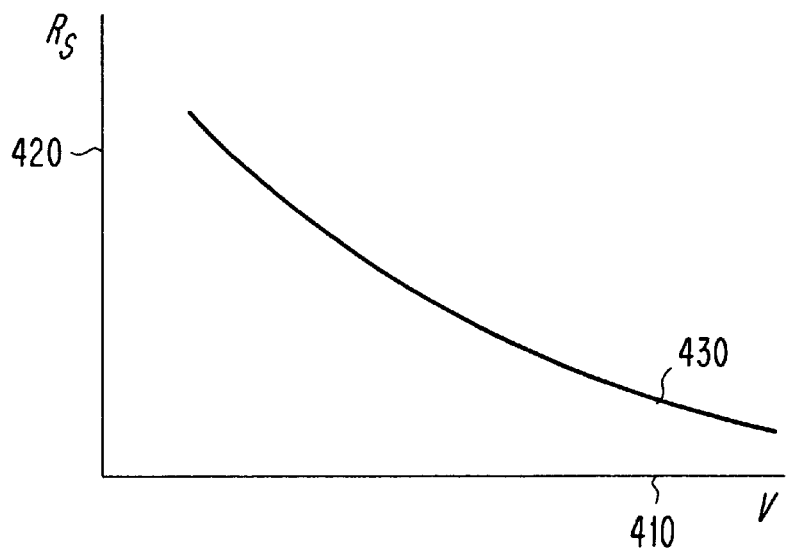
FIG. 4 is a graph showing the series resistance of a varactor diode versus the varactor bias voltage.

However, as illustrated in FIG. 4, as the voltage across varactor diode D1 decreases, the internal resistance of diode D1 increases. The internal resistance of diode D1 directly affects the resistance of the resonant circuit of VCO 200, lowering the quality factor of the resonant circuit and affecting the noise performance of VCO 200. Thus, when a low-range control voltage is used to control VCO 200, VCO 200 will exhibit unsatisfactory noise characteristics. And, as noted above, in a three-cell device, there is a reduced DC voltage range available to control VCO 200.

Figure 5:
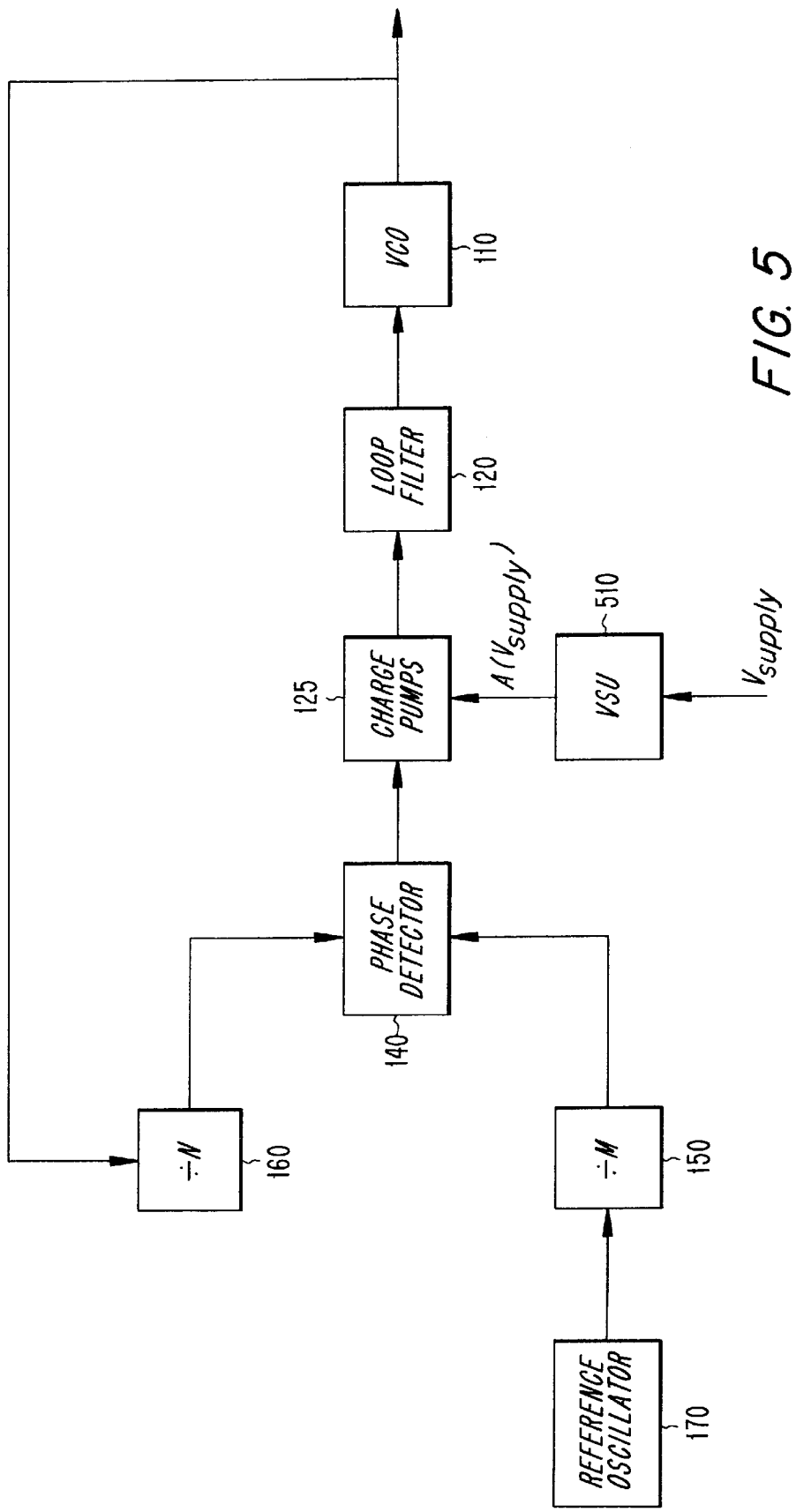
FIG. 5 is block diagram of a phase lock loop with a voltage set-up unit in accordance with an exemplary embodiment of the present invention.

In order to provide an increased DC control voltage range, while employing fewer battery cells to control a VCO in a PLL circuit, the present invention provides a voltage step-up unit 510 between the supply voltage and the charge pump, as illustrated in FIG. 5. A voltage step-up unit (VSU), i.e., a voltage multiplier, 510 multiplies the supply voltage, $V_{supply}$, by a programmable factor A and applies the resulting voltage to the charge pumps of the phase locked loop as described in FIG. 1 previously. This increases the control voltage range available to the VCO 110. As a result, the gain of the VCO 110 decreases and noise is reduced. In this exemplary embodiment, an internal oscillator (not shown) is located within the VSU 510 circuit. Any suitable oscillator, such as a ring oscillator or multi-vibrator, can be used to activate the switches of the VSU 510, the details of which are discussed below.

Figure 6:
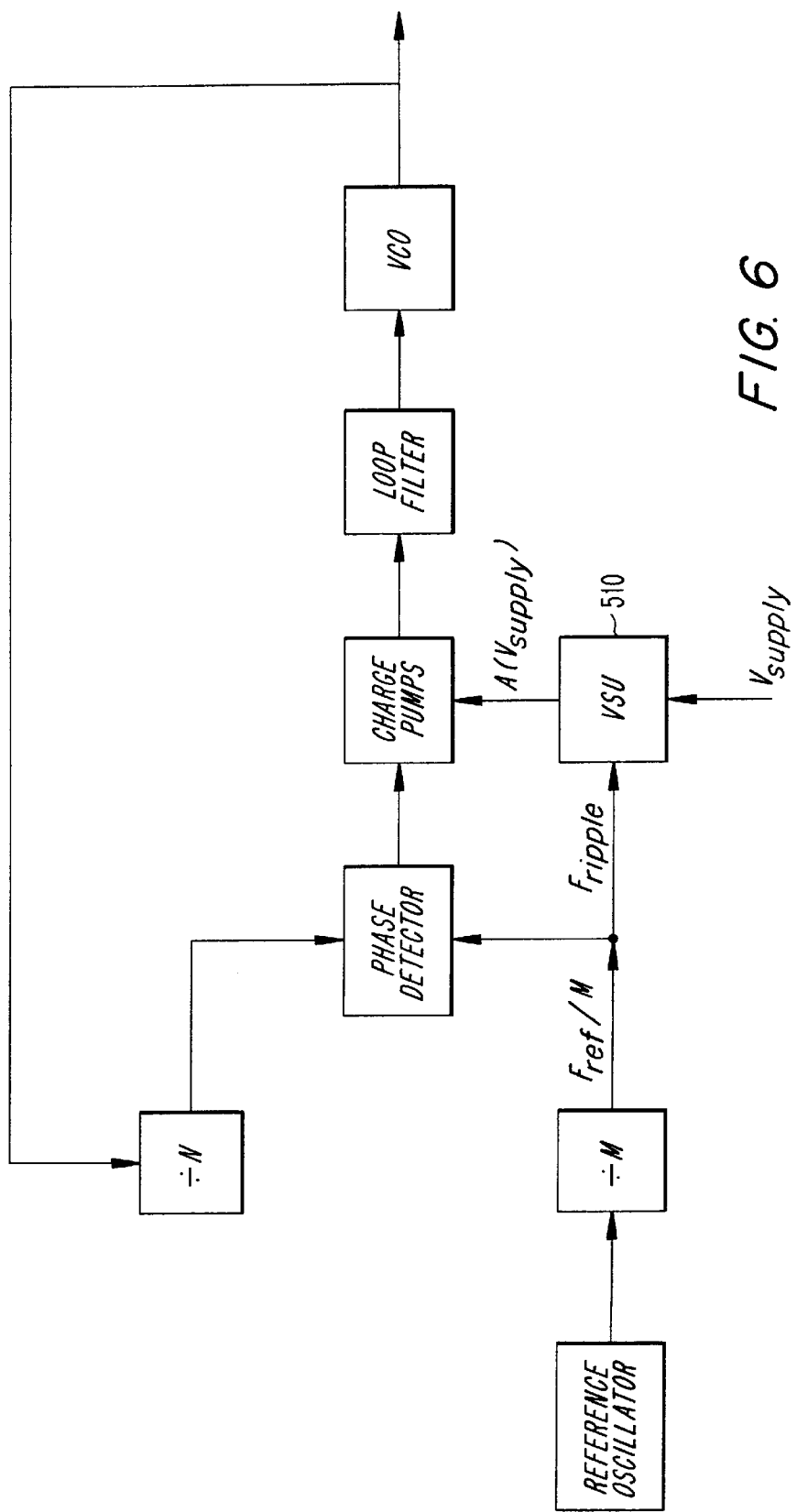
FIG. 6 is a block diagram of a phase lock loop with a voltage step-up unit receiving a reference frequency signal from the synthesizer in accordance with the an exemplary embodiment of the present invention.

In another exemplary embodiment of the invention illustrated in FIG. 6, PLLs according to the present invention can also use the output, $F_{ref}/M$ of the divider 150 as a clock input to the voltage step-up unit 510. The operation of the remainder of the circuit is the same as discussed above with respect to FIG. 1. Since the frequency signal used is based on the signal from the reference oscillator 170, the VSU 510 is not required to have its own crystal oscillator for clocking its output to the charge pumps 125. This reduces the number of hardware components within the system. No external equipment is required to build the VSU 510 and RF interference is kept to a minimum due to the dependency of the switching on existing frequencies. The frequency, $F_{ripple}$, is now programmable and in this embodiment, is equal to the comparison frequency of the phase detector 140.

Figure 7:
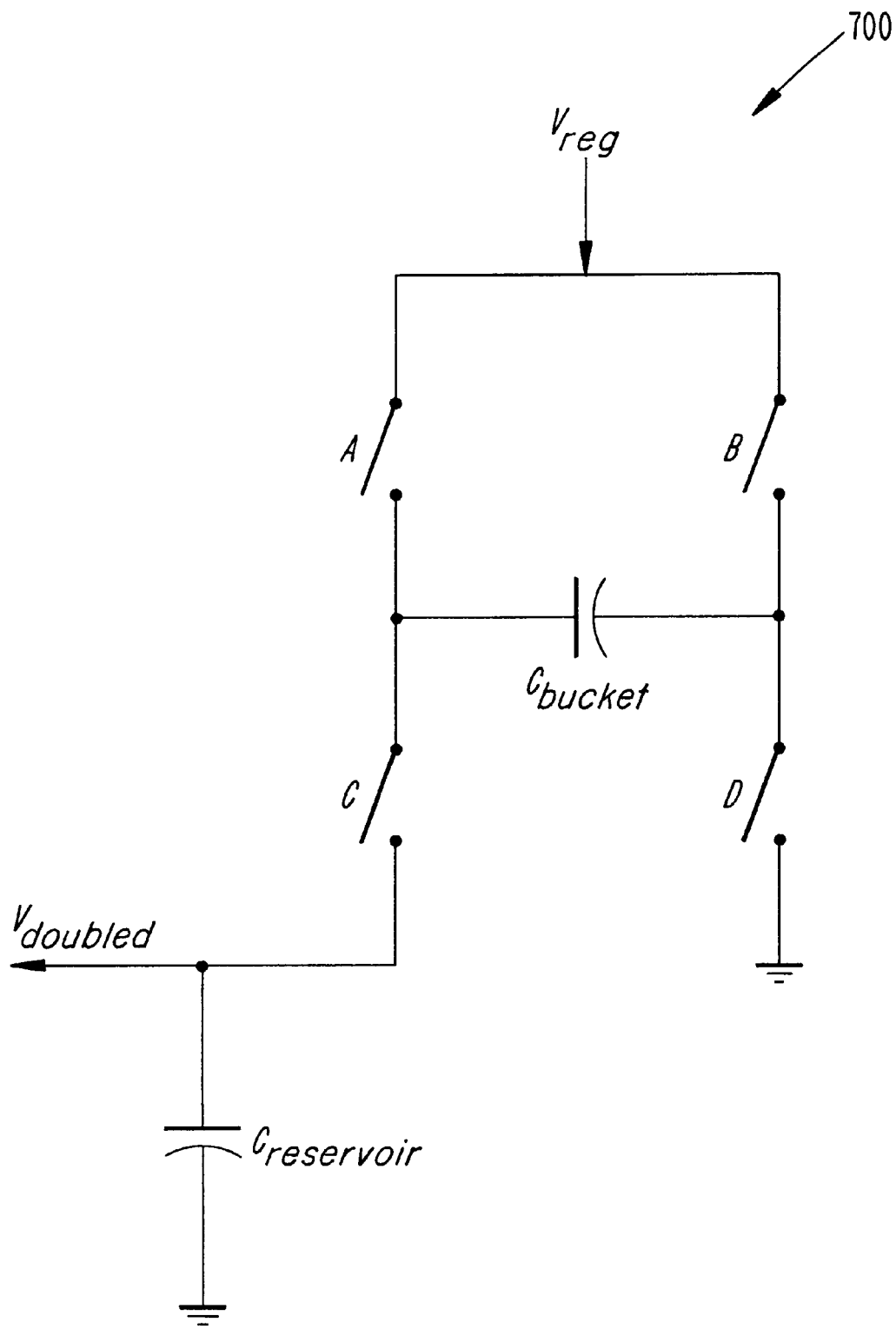
FIG. 7 is a schematic diagram of a capacitive-type multiplier in accordance with an exemplary embodiment of the present invention.

The voltage step-up unit 510 can be configured using any known voltage multiplier topology (i.e., capacitive-type or diode type) to multiply the voltage supply by any factor A. However, for purposes of illustration, in FIG. 7, a capacitive voltage doubler 700 is disclosed as an exemplary voltage step-up unit. The operation of the voltage step-up unit 510 is as follows. Switches A and D are initially closed to charge the bucket capacitor to $V_{reg}$ at switch node A. Switches A and D are then opened and the capacitor retains the charge. Next, switches B and C are closed and the formerly grounded node is now referenced to $V_{reg}$. The voltage across the reservoir capacitor is twice the regulated voltage, referenced to ground, which voltage can now be output to the charge pump. Although the foregoing example of VSU 510 provides for voltage doubling, those skilled in the art will appreciate that the VSU can be configured to multiply the supply voltage by any desired factor.

The following equations can be used to derive values for the capacitors:

$$V/I_{load}R_{eqv}=1/(F*C_{bucket}) \qquad (1)$$

$$V_{ripple}=I_{load}/(C_{reservoir}*F_{ripple}), \qquad (2)$$

where $V_{ripple}$ is the RMS value of the maximum voltage at the frequency, F, at which the capacitor may be operated continuously at a specified temperature. $R_{eqv}$ is the equivalent series AC resistance of the capacitor at a specified clocking frequency, $F_{ripple}$.

A specific example will further illustrate how VSU 510 can be designed. Consider a maximum load current, $I_{load}$ to be 5 mA. If the design objective for VSU 510 is, for example, to double a supply voltage of 2.5 V to 5 V with a 5 mA current capability, then $R_{eqv}$ will equal 1 Kohm. Assume that the frequency $F_{ripple}$ is 720 KHz. With the above described values equation (1) indicates that a bucket capacitance, $C_{bucket}$, of 1.39 nF can be used in VSU 510. It is also desirable to use the frequency $F_{ripple}$ for voltage generation because this frequency is already part of the filtering requirement for the loop filter and, thus, would not require any further filtering or adaptations of the loop filter 120. Furthermore, either of the dividers 150 and 160 used to generate a divided reference signal could also be used for generation of the required switching signals in VSU 510.

In determining the reservoir capacitance, $C_{reservoir}$, using equation (2), assume that a good regulator provides 60 dB ripple rejection. To achieve this level of ripple rejection at 720 KHz and 5 mA of load current, a 1.39 uF capacitor is needed. Using the above described implementation the gain of the system reduces from 50 to 19. Assuming a regulated voltage of 2.5 Volts, the tuning voltage range would have been 2.0–0.5 Volts or a 1.5 Volt range. The doubled voltage has widened the tuning range to 4.5–0.5 Volts or a 4 Volt range. As a result, the noise is reduced to an acceptable level which is approximately the same amount of noise which is currently encountered in five cell phones. Thus, there is an improvement in the reduction of battery cells but without an associated increase in noise.

Figure 8:
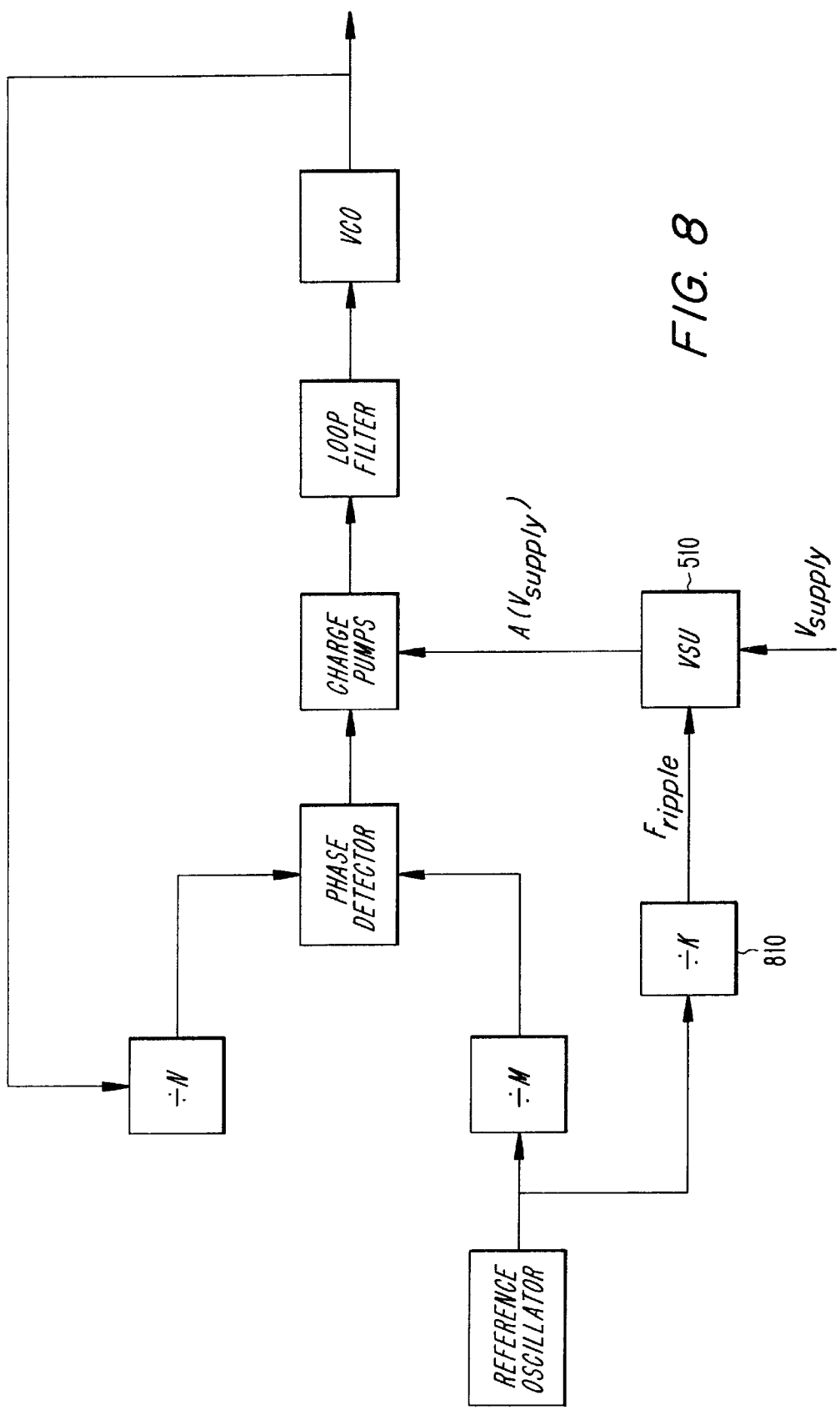
FIG. 8 is a block diagram of a phase lock loop with a voltage step-up unit with an added divider in accordance with an exemplary embodiment of the present invention.

In accordance with the block diagram illustrated in FIG. 8, another exemplary embodiment of the invention is also contemplated where the reference signal to be input into the voltage step-up unit 510 can be drawn before the divide-by-M divider. This permits the use of an independent divide-by-K divider 810 on the line between the frequency reference signal and the voltage step-up unit. This third divider 810, whose value can be varied using any known mechanism, e.g. a masked-in hardwired memory or a programmable microprocessor (not shown), implies that the ripple frequency, which is given with the equation:

$$F_{ripple}=F_{ref}/k \qquad (3)$$

can be controlled independently of the comparison frequency input to the phase detector. Both the independent divide-by-K divider 810 and the VSU 510 can be fabricated on the same integrated circuit (IC) as the other elements of the frequency synthesizer or they can be fabricated on one or more separate ICs. When the comparison frequency is low, this added flexibility is quite desirable. Furthermore, any affects of the VSU 510 or the comparison frequency are eliminated.

As mentioned earlier, VCOs and PLLs according to the present invention may be used in, for example, cellular telephone units. For example, these devices can be used to generate frequencies associated with the radio channels used to support communications between mobile and base stations in radio communication systems. FIG. 9 represents a block diagram of an exemplary cellular mobile radio telephone system according to one embodiment of the present invention in which VCOs and PLLs described above can be used to generate frequencies for tuning to desired channels. The system shows an exemplary base station 910 and a mobile 920. The base station includes a control and processing unit 930 which is connected to the MSC 940 which in turn is connected to the public switched telephone network (not shown).

The base station 910 for a cell includes a plurality of voice channels handled by voice channel transceiver 950 which is controlled by the control and processing unit 930. Also, each base station includes a control channel transceiver 960 which may be capable of handling more than one control channel. The control channel transceiver 960 is controlled by the control and processing unit 930. The control channel transceiver 960 broadcasts control information over the control channel of the base station or cell to mobiles locked to that control channel. The voice channel transceiver handles the traffic or voice channels which can include digital control channel location information as described previously.

When the mobile 920 first enters the idle mode, it periodically scans the control channels of base stations like base station 910 to determine which cell to lock on or camp to. The mobile 920 receives the absolute and relative information broadcasted on a control channel at its voice and control channel transceiver 970. Then, the processing unit 980 evaluates the received control channel information which includes the characteristics of the candidate cells and determines which cell the mobile should lock to. The received control channel information not only includes absolute information concerning the cell with which it is associated, but also contains relative information concerning other cells proximate to the cell with which the control channel is associated. These adjacent cells are periodically scanned while monitoring the primary control channel to determine if there is a more suitable candidate. Additional information relating to specifics of mobile and base station implementations can be found in U.S. patent application Ser. No. 07/967,027 entitled "Multi-Mode Signal Processing" filed on Oct. 27, 1992 to P. Dent and B. Ekelund, which disclosure is incorporated by reference.

Although the foregoing exemplary embodiment has been described in terms of base and mobile stations, the present invention can be applied to any radiocommunication system. For example, satellites could transmit and receive data in communication with remote devices, including portable units, PCS devices, personal digital assistants, etc.

While the present invention has been described with respect to its preferred embodiment, those skilled in the art will recognize that the present invention not limited to the specific embodiment described and illustrated herein. Different embodiments and adaptations besides those shown herein and described as well as many variations, modifications and equivalent arrangements will now be apparent or will be reasonably suggested by the foregoing specification and drawings without departing from the substance of the scope of the invention.

What is claimed is:

1. A method of operating a phase locked loop circuit comprising:
   generating an output signal from a voltage controlled oscillator (VCO);
   applying an input voltage from a charge pump to said VCO;
   receiving said output signal from said VCO in a first divider and outputting a divided signal to a phase detector;
   receiving a reference frequency signal at a second divider and applying the reference frequency signal to said phase detector;
   outputting a signal from said phase detector to said charge pump;
   receiving a reference frequency signal at a third divider and applying an output signal to a voltage step-up unit; and
   multiplying a supply voltage input to the charge pump, wherein the step of multiplying comprising:
      connecting a first and second switch to a supply voltage source;
      connecting said first switch to a third switch and a bucket capacitor;
      connecting said second switch to a fourth switch and said bucket capacitor;
      grounding said fourth switch;
      connecting said third switch to a supply voltage output and to a reservoir capacitor; and
      grounding said reservoir capacitor.

2. The method of operating a phase lock loop circuit of claim 1, further comprising the step of:
   filtering said input voltage prior to applying said input voltage to said VCO.

3. The method of claim 1, further comprising the step of:
   receiving a reference frequency signal at a voltage step-up unit from the output of said second divider.

4. The method of claim 1, further comprising the steps of:
   placing said phase locked loop circuit on a first IC;
   placing said third divider on a second IC different from said first IC.

5. The method of claim 4, further comprising the step of:
   placing a circuit used in said multiplying step on a third IC different from said first and second ICs.

6. The method of claim 4 further comprising the step of:
   placing a circuit used in said multiplying step on said second IC.

7. A phase locked loop circuit comprising:
   a voltage controlled oscillator (VCO) which generates an output signal;
   a charge pump which applies an input voltage to said VCO;
   a voltage step-up unit for multiplying a supply voltage input to said charge pump by a predefined value, wherein said voltage step-up unit further comprises:
      a first and second switch connected to the supply voltage;
      said first switch connected to a third switch and a bucket capacitor;
      said second switch connected to a fourth switch and said bucket capacitor;
      said fourth switch connected to ground; and
      said third switch connected to a supply voltage output and to a reservoir capacitor which is connected to ground;
   and a feedback loop provided between said output of said VCO and an input of said charge pump, wherein the feedback loop further comprises:
      a phase detector which outputs a signal to said charge pump;
      a divider that receives a reference frequency signal and applies the reference frequency signal to said phase detector; and
      a divider which receives said reference frequency signal and generates a clocking signal for input to said voltage step-up unit.

8. A phase locked loop circuit comprising:
   a voltage controlled oscillator (VCO) which generates an output signal;
   a charge pump which applies an input voltage to said VCO;
   a voltage step-up unit for multiplying a supply voltage input to said charge pump by a predefined value, wherein said voltage step-up unit further comprises:
      a first and second switch connected to the supply voltage;
      said first switch connected to a third switch and a bucket capacitor;
      said second switch connected to a fourth switch and said bucket capacitor;
      said fourth switch connected to ground; and
      said third switch connected to a supply voltage output and to a reservoir capacitor which is connected to ground;
   and a feedback loop provided between said output of said VCO and an input of said charge pump, wherein the feedback loop further comprises:
      a phase detector which outputs a signal to said charge pump;
      a first divider which receives said output signal from said VCO and outputs a signal to said phase detector;
      a second divider that receives a reference frequency signal and applies the reference frequency signal to said phase detector; and a third divider which receives said reference frequency signal and generates a clocking signal for input to said voltage step-up unit.

9. The phase locked loop circuit of claim 8, further comprising a loop filter for removing transients from said input voltage.

10. The phase locked loop circuit of claim 8, wherein said voltage step-up unit receives a clocking signal from the output of said second divider.

11. The phase locked loop circuit of claim 8, wherein said third divider and other elements of said phase locked loop circuit are located on separate ICs.

12. The phase locked loop circuit of claim 11, wherein said voltage step-up unit is located on a third, separate IC.

13. The phase locked loop circuit of claim 11 wherein said voltage step-up unit is located on the same IC as said third divider.

* * * * *